United States Patent
Kang

(10) Patent No.: US 7,170,770 B2
(45) Date of Patent: Jan. 30, 2007

(54) NONVOLATILE FERROELECTRIC PERPENDICULAR ELECTRODE CELL, FERAM HAVING THE CELL AND METHOD FOR MANUFACTURING THE CELL

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 87 days.

(21) Appl. No.: 11/057,167

(22) Filed: Feb. 15, 2005

(65) Prior Publication Data

US 2005/0237779 A1    Oct. 27, 2005

(30) Foreign Application Priority Data

Apr. 23, 2004    (KR) ............... 10-2004-0028291

(51) Int. Cl.
    *G11C 11/42*    (2006.01)
(52) U.S. Cl. ............... 365/65; 365/151; 365/175
(58) Field of Classification Search ........... 365/65, 365/151, 175, 145, 149, 243
    See application file for complete search history.

(56) References Cited

U.S. PATENT DOCUMENTS

| | | | |
|---|---|---|---|
| 5,146,299 A | 9/1992 | Lampe et al. | |
| 5,436,490 A | 7/1995 | Nakamura | |
| 5,471,417 A | 11/1995 | Krautschneider et al. | |
| 5,498,888 A | 3/1996 | Ozawa | |
| 6,272,594 B1 | 8/2001 | Gupta et al. | |
| 6,363,439 B1 | 3/2002 | Battles et al. | |
| 6,495,878 B1 | 12/2002 | Hayashi et al. | |
| 6,545,902 B2 * | 4/2003 | Sakata et al. | 365/145 |
| 6,686,211 B1 | 2/2004 | Asakawa | |
| 6,734,478 B2 | 5/2004 | Johansson et al. | |
| 6,812,509 B2 | 11/2004 | Xu | |
| 2004/0209420 A1 | 10/2004 | Ljungerantz et al. | |

FOREIGN PATENT DOCUMENTS

KR    1999-0080861 A    11/1999

* cited by examiner

*Primary Examiner*—Van Thu Nguyen
*Assistant Examiner*—Dang Nguyen
(74) *Attorney, Agent, or Firm*—Heller Ehrman LLP

(57) ABSTRACT

A nonvolatile ferroelectric perpendicular electrode cell comprises a ferroelectric capacitor and a serial PN diode switch. The ferroelectric capacitor includes a word line perpendicular electrode as a first electrode and a storage perpendicular electrode as a second electrode apart at a predetermined interval from the word line perpendicular electrode to have a column type, where a ferroelectric material is filled in a space where the first electrode are separated from the second electrode. The serial PN diode switch, which is connected between a bit line and the ferroelectric capacitor, selectively switches a current direction between the bit line and the ferroelectric capacitor depending on voltage change between the bit line and the ferroelectric capacitor.

4 Claims, 17 Drawing Sheets

NONVOLATILE FERROELECTRIC PERPENDICULAR ELECTRODE CELL, FERAM HAVING THE CELL AND METHOD FOR MANUFACTURING THE CELL

BACKGROUND OF THE INVENTION

1. Field of the Invention

The present invention generally relates to a perpendicular electrode cell and a nonvolatile ferroelectric memory having the same, and more specifically, to a perpendicular electrode cell having an improved cell structure where a ceramic ferroelectric material used in a ferroelectric capacitor can be substituted with a ferroelectric polymer thin film having a perfect hysteresis loop curve with its small size which enables a low temperature process, and a nonvolatile ferroelectric memory using the same.

2. Background of the Prior Art

Generally, a ferroelectric random access memory (hereinafter, referred to as 'FeRAM') has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

However, PZT and SBT which are ceramic dielectric materials used as conventional ferroelectric capacitor materials require a high temperature process of more than 600° C. and limit selection of electrodes of the capacitor. Also, the conventional ceramic ferroelectric materials have degraded uniformity in characteristics of each cell, which results in difficulty in improvement of yield.

In order to solve this problem, the conventional ceramic ferroelectric material is substituted with a ferroelectric polymer thin film. The ferroelectric polymer thin film includes P(VDF-TrFE), PVDF, Cyanopolymers, polyureas, polythioureas and odd-numbered nylons.

The ferroelectric polymer thin film can be processed at low temperature of less than 200° C., and has its size of 2Pr=5 uC/cm$^2$ but shows a perfect P-V hysteresis loop curve characteristic, so that it is advantageous in improvement of the uniformity of the cell. Also, the ferroelectric polymer thin film can reduce the process cost remarkably, improve the uniformity of the cell to advance productivity, and embody memory capacity of high density.

However, a conventional ferroelectric memory cell does not use-the above-described ferroelectric polymer thin film materials because it has a structure that does not utilize process materials of low temperature (less than 200° C.).

SUMMARY OF THE INVENTION

Accordingly, it is an object of the present invention to improve the structure of a ferroelectric cell, thereby obtaining a nonvolatile ferroelectric cell using ferroelectric materials which require a low temperature process.

It is another object of the present invention to provide FeRAM having the nonvolatile ferroelectric cell using ferroelectric materials which require a low temperature process.

In an embodiment, a nonvolatile ferroelectric perpendicular electrode cell comprises a ferroelectric capacitor and a serial PN diode switch.

The ferroelectric capacitor includes a storage node perpendicular electrode which is a lower electrode, a word line perpendicular electrode which is an upper electrode formed to enclose the circumference of the lower electrode and a ferroelectric film having a ferroelectric material filled in a space where the lower electrode and the upper electrode. The serial PN diode switch, which is connected between a bit line and the ferroelectric capacitor, selectively switches a current direction between the bit line and the ferroelectric capacitor depending on voltage change between the bit line and the ferroelectric capacitor.

In an embodiment, a nonvolatile ferroelectric memory device having a perpendicular electrode cell comprises a perpendicular electrode cell array, a word line driving unit, a sense amplifier unit, a data bus and a main amplifier unit. The perpendicular electrode cell array includes a plurality of perpendicular electrode cells for reading and writing cell data. Here, each perpendicular electrode cell including a plurality word lines and a plurality of bit lines that cross each other orthogonally and includes a ferroelectric capacitor having both electrodes and ferroelectric layers that are formed perpendicular to the bit lines and includes a switching device for selectively switching a current direction depending on voltage change between the ferroelectric capacitor and the bit line. The word line driving unit selectively activates the word line perpendicular electrodes. The sense amplifier unit senses cell data applied to the bit line. The data bus transmits read data sensed in the sense amplifier unit and write data to be transmitted to the sense amplifier unit. The main amplifier unit amplifies the read data applied from the data bus and outputting the read data to the data buffer.

In an embodiment, a method for manufacturing a nonvolatile ferroelectric perpendicular electrode cell comprises: a first step of forming a serial PN diode switch to connect a PN diode to a PNPN diode in serial; a second step of forming a bit line contact node and a capacitor contact node on the serial PN diode switch to connect the bit line contact node to a bit line; a third step of depositing an electrode material perpendicular on the capacitor contact node; a forth step of etching the electrode material to be separated at a predetermined interval into a storage perpendicular electrode and a word line perpendicular electrode; a fifth step of coating a ferroelectric material on the perpendicular electrodes and the etched region between the storage perpendicular electrode and the word line perpendicular electrode to form a ferroelectric layer of a ferroelectric capacitor; and a sixth step of performing an anneal process on the ferroelectric material.

BRIEF DESCRIPTION OF THE DRAWINGS

Other aspects and advantages of the present invention will become apparent upon reading the following detailed description and upon reference to the drawings in which.

DETAILED DESCRIPTION OF THE PERFERRED EMBODIMENTS

The present invention will be described in detail with reference to the accompanying drawings.

Figure 1:
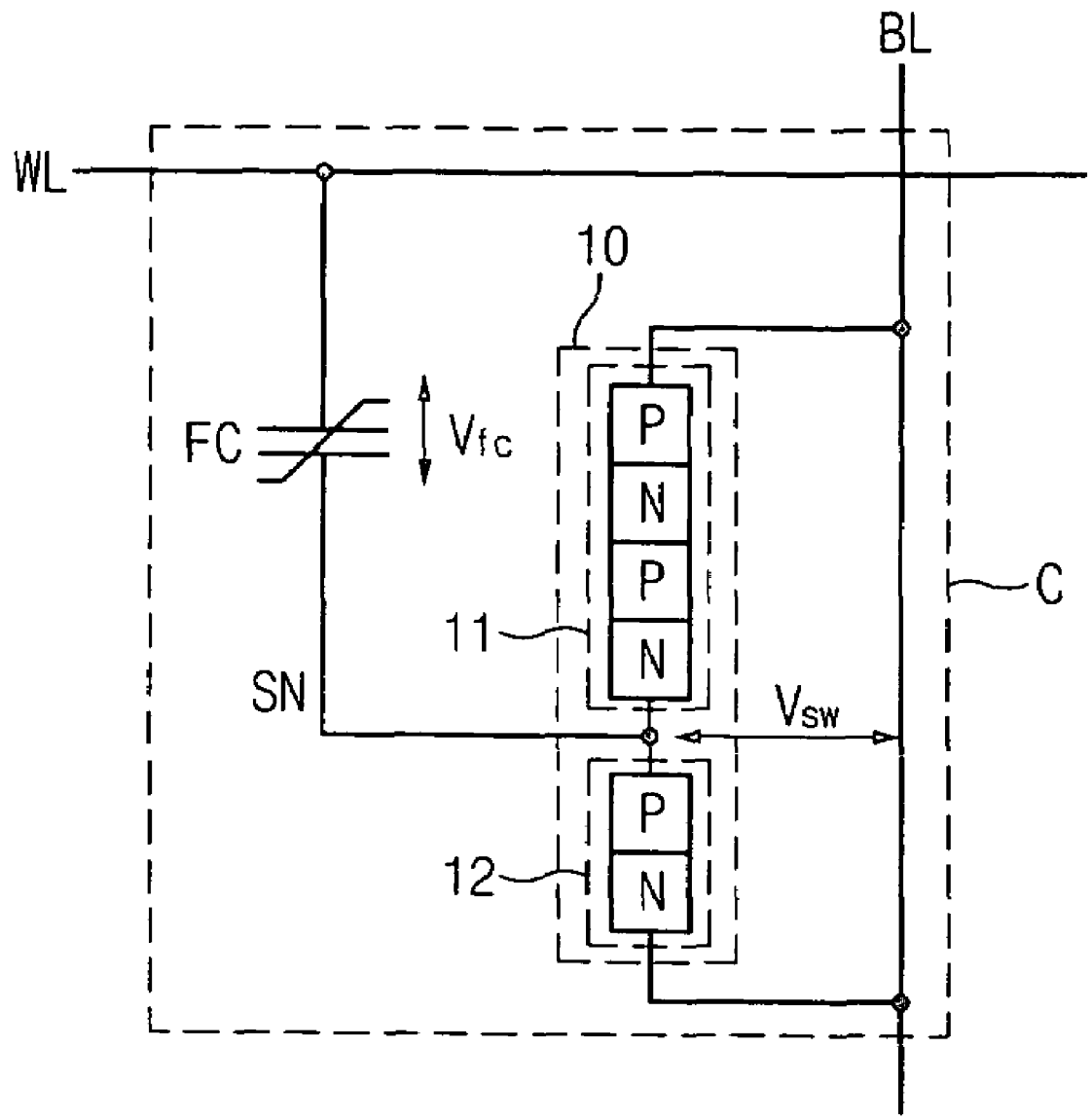
FIG. 1 is a circuit diagram illustrating a unit perpendicular electrode cell according to an embodiment of the present invention.

FIG. 1 is a circuit diagram illustrating a unit perpendicular electrode cell according to an embodiment of the present invention.

In an embodiment, a perpendicular electrode cell comprises a ferroelectric capacitor FC and a serial PN diode switch 10.

The ferroelectric capacitor FC has a perpendicular electrode structure and includes a ferroelectric poly thin film as a ferroelectric material. One electrode of the ferroelectric capacitor FC is connected to a word line WL, and the other electrode is connected in common to a N terminal of a PNPN diode 11 and a P terminal of a PN diode 12 of the serial PN diode switch 10.

The serial PN diode switch 10 selectively switches a direction of current between a bit line BL and the ferroelectric capacitor FC depending on voltage change of the bit line BL and the ferroelectric capacitor FC through a serial PN diode chain switch technology. The serial PN diode switch 10 includes the PNPN diode 11 and the PN diode 12 which are connected in parallel between the one electrode of the ferroelectric capacitor FC and the bit line BL. That is, the PNPN diode 11 makes current flow in a forward direction from the bit line BL to the ferroelectric capacitor FC, and the PN diode 12 makes current a forward direction from the ferroelectric capacitor FC to the bit line BL.

Figure 2:
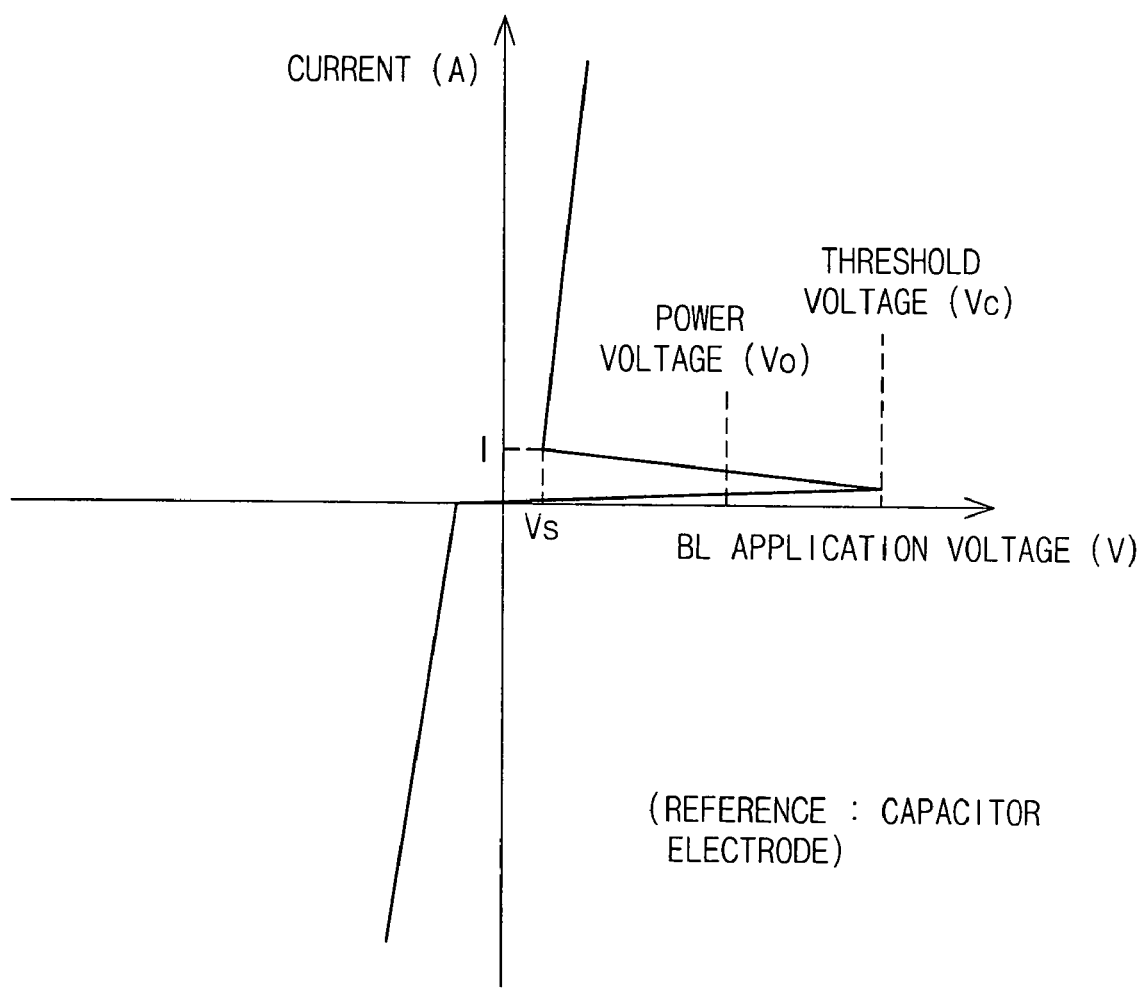
FIG. 2 is a diagram illustrating the operation principle of a serial PN diode switch of FIG. 1.

FIG. 2 is a diagram illustrating the operation principle of the serial PN diode switch 10 of FIG. 1.

When a voltage of the bit line BL increases toward a positive direction based on the ferroelectric capacitor FC, the serial PN diode switch 10 is kept off by the characteristic of the PNPN diode while the voltage of the bit line BL is an operating voltage Vo. However, when the voltage of the bit line BL increases to a threshold voltage Vc, the serial PN diode switch 10 is turned on by the PNPN diode 11, so that the current flowing from the bit line BL to the ferroelectric capacitor FC increases remarkably. Here, when the voltage of the bit line BL is over the threshold voltage Vc, the amount I of current flowing through the PNPN diode 11 depends on a value of a resistor (not shown) which serves as a load connected to the bit line BL. When the PNPN diode 11 is turned on, a large amount of current can flow through the PNPN diode 11 although an extremely low voltage Vs is applied to the bit line BL. Here, the PN diode 12 is kept off by a backward direction voltage.

On the other hand, when the voltage of the bit line BL increases toward a negative direction based on the ferroelectric capacitor FC, that is, a predetermined voltage is applied to the word line WL, the PN diode 12 is turned on by the forward direction characteristic, so that current flows from the ferroelectric capacitor FC to the bit line BL through the serial PN diode switch 10. Here, the PNPN diode 11 is kept off by the backward direction voltage.

Figure 3:
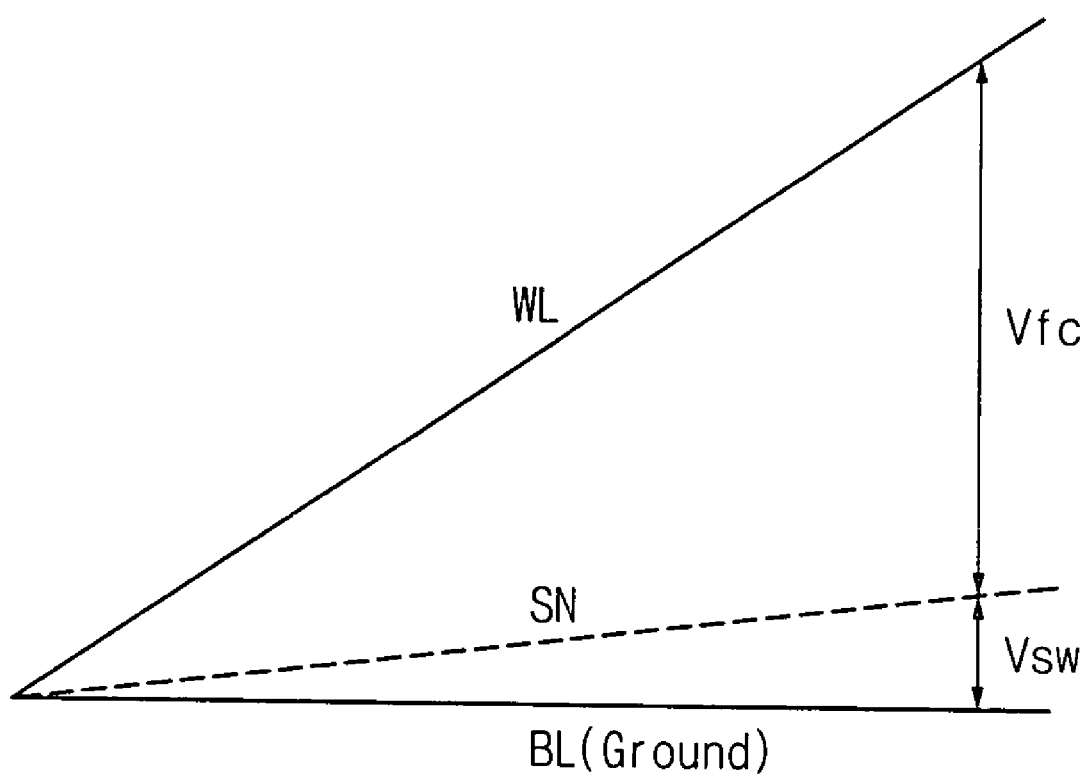
FIG. 3 is a diagram illustrating the dependency of the perpendicular electrode cell of FIG. 1 on a word line voltage.

FIG. 3 is a diagram illustrating the dependency of the perpendicular electrode cell of FIG. 1 on a word line voltage.

As shown in FIG. 1, a voltage between both terminals of the ferroelectric capacitor FC is defined as Vfc, and a voltage between both terminals of the serial PN diode switch 10 is defined as Vsw.

When a voltage of the word line WL increases while the voltage of the bit line BL is fixed at a ground voltage level, the voltage of the word line WL is distributed to the ferroelectric capacitor FC and the serial PN diode switch 10.

Figure 4:
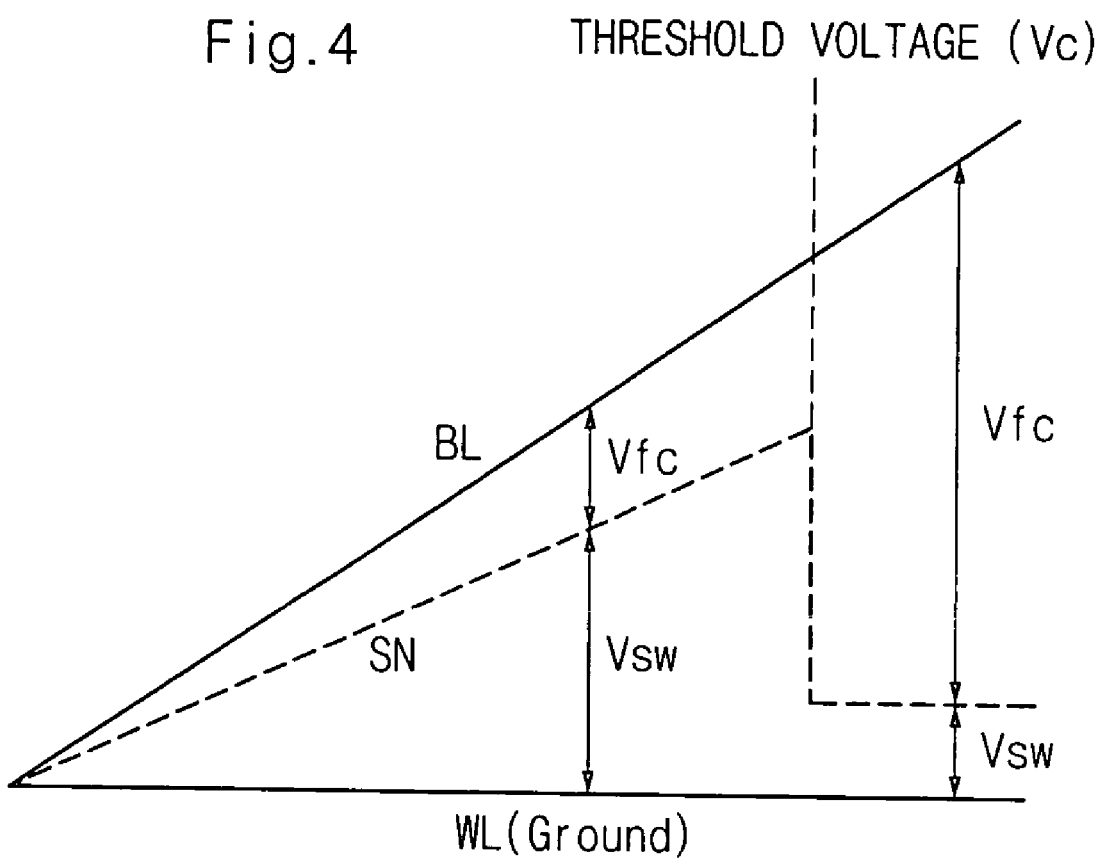
FIG. 4 is a diagram illustrating the dependency of the perpendicular electrode cell of FIG. 1 on a bit line voltage.

Here, Most of the voltage of the word line WL is applied to the voltage Vfc of both terminals of the ferroelectric capacitor FC, so that the operation characteristic of the ferroelectric capacitor FC is improved. On the other hand, a smaller voltage than the voltage Vfc is applied to both voltage Vfc terminals of the serial PN diode switch 10 by the forward direction operation of the PN diode 12. FIG. 4 is a diagram illustrating the dependency of the perpendicular electrode cell of FIG. 1 on a bit line BL voltage.

When the voltage of the bit line BL increases while the voltage of the word line WL is fixed at the ground voltage level, the voltage of the bit line BL is distributed to the ferroelectric capacitor FC and the serial PN diode switch 10. Here, the ratio of the voltage distributed to the ferroelectric capacitor FC and the serial PN diode switch 10 is differentiated on a basis of the threshold voltage Vc.

That is, before the voltage of the bit line BL reaches the threshold voltage Vc, the PNPN diode 11 is kept off by the characteristic of the PNPN diode. Since the PN diode 12 is kept off by the backward direction voltage, most of the voltage of the bit line BL is applied to the voltage Vsw of both terminals of the serial PN diode switch 10. As a result, a smaller voltage than the voltage Vsw is applied to both voltage Vfc terminals of the ferroelectric capacitor FC, which does not result in change of data in the ferroelectric capacitor FC.

However, when the voltage of the bit line BL increases over the threshold voltage Vc, the PNPN diode 11 of is turned on, so that most of the voltage of the bit line BL is applied to both voltage Vfc terminals of the ferroelectric capacitor FC. As a result, new data can be written in the ferroelectric capacitor FC.

Figure 5:
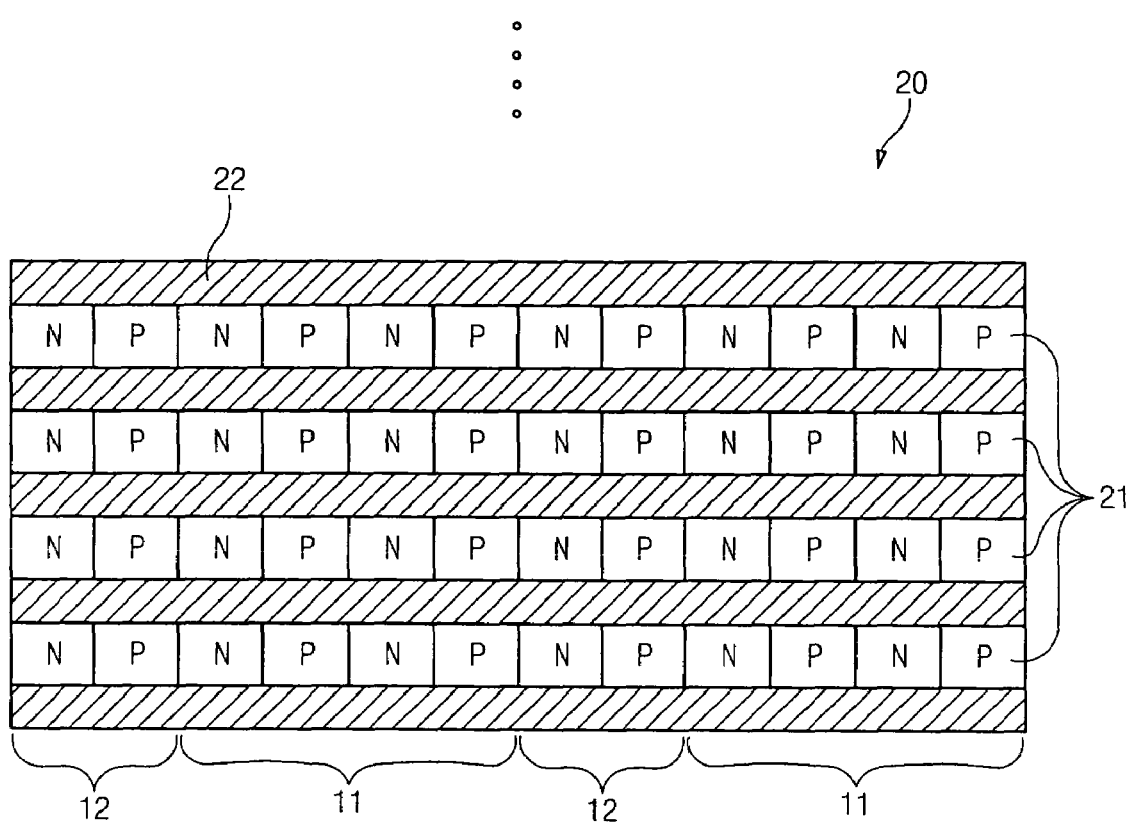
FIG. 5 is a plane diagram illustrating the structure of a serial PN diode chain layer according to an embodiment of the present invention.

FIG. 5 is a plane diagram illustrating the structure of a serial PN diode chain layer according to an embodiment of the present invention.

A serial PN diode chain layer 20 includes a serial PN diode chain 21 and an insulating isolation layer 22 on a growth silicon layer or a poly silicon layer. The serial PN diode chain 21 includes a plurality of PN diodes connected serially with a chain type, and a plurality of the PN diode chain 21 are formed in parallel with each other at a predetermined interval. The insulating isolation layer 22 is formed between the serial PN diode chain 21.

Each serial PN diode chain 21 includes the PNPN diode 11 and the PN diode 12 which are successively connected in serial. The PNPN diode 11 includes a P-type region and a N-type region which are alternately connected in serial. The PN diode 12 includes a P-type region and a N-type region which are successively connected in serial. Here, the P-type region is serially connected adjacent to the N-type region of the PNPN diode11 and the N-type region is serially connected adjacent to the P-type region of the PNPN diode 11. As a result, the serial PN diode switch 10 of each perpendicular electrode cell can be formed by successively selecting one PN diode 12 and one PNPN diode 11 connected serially thereto in the serial PN diode chain 21.

FIGS. 6 to 9 are diagrams illustrating a method for manufacturing a perpendicular electrode cell according to an embodiment of the present invention.

In an embodiment, a perpendicular electrode cell C is formed on a CMOS device region 30 which requires a high temperature process.

An interlayer insulating layer 40 is deposited on the CMOS device region 30.

The serial PN diode chain layer 20 shown in FIG. 5 is formed on the interlayer insulating layer 40 for forming the serial PN diode switch 10. The serial PN diode chain layer 20 is obtained by depositing poly silicon on the interlayer insulating layer 40 and forming the serial PN diode chain 21 and the insulating isolation layer 22 on the poly silicon.

In the serial PN diode chain 21, the PN diode 12 and the PNPN diode 11 are successively connected in serial, and one PN diode 12 and one PNPN diode 11 connected serially thereto form one serial PN diode switch 10.

Here, bit line contact nodes BLCN are formed at a N terminal of the PN diode 12 and a final P terminal of the PNPN diode 11, which are connected to the bit line BL. A contact node CN is formed on a P terminal of the PN diode 12 and a N terminal of the PNPN diode 11 adjacent thereto, which is connected to one electrode of the ferroelectric capacitor FC having a perpendicular electrode structure.

Figure 6:
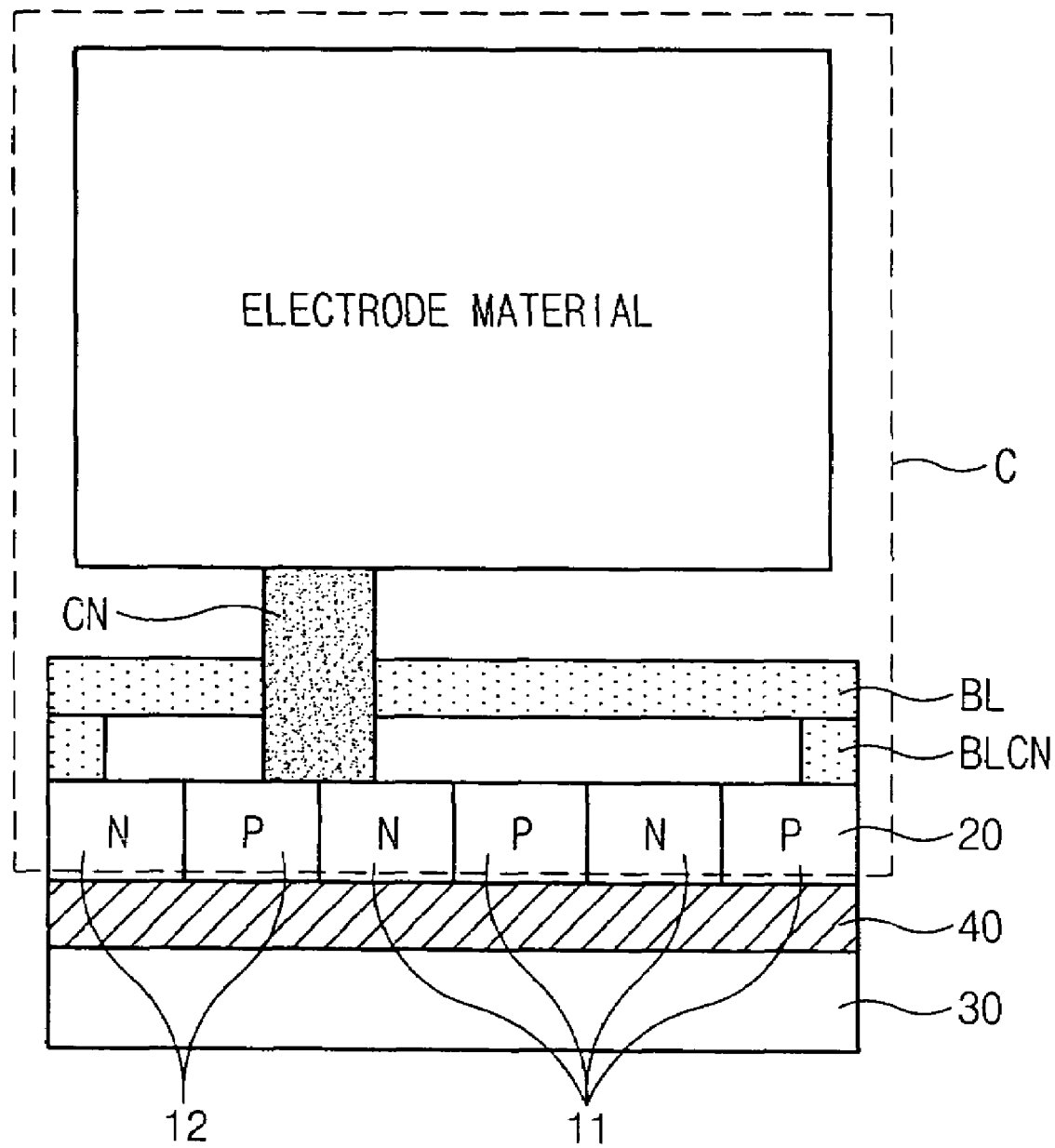
FIGS. 6 to 9 are diagrams illustrating a method for manufacturing a perpendicular electrode cell according to an embodiment of the present invention.

In order to form a ferroelectric capacitor FC having the above-described perpendicular electrode structure, an electrode material is deposited at a predetermined depth to contact with the contact node CN as shown in FIG. 6. Here, the electrode materials includes gold, platinum, aluminum, titanium, ITO, polyaniline, polypyrrol and other conductive materials.

Figure 7:
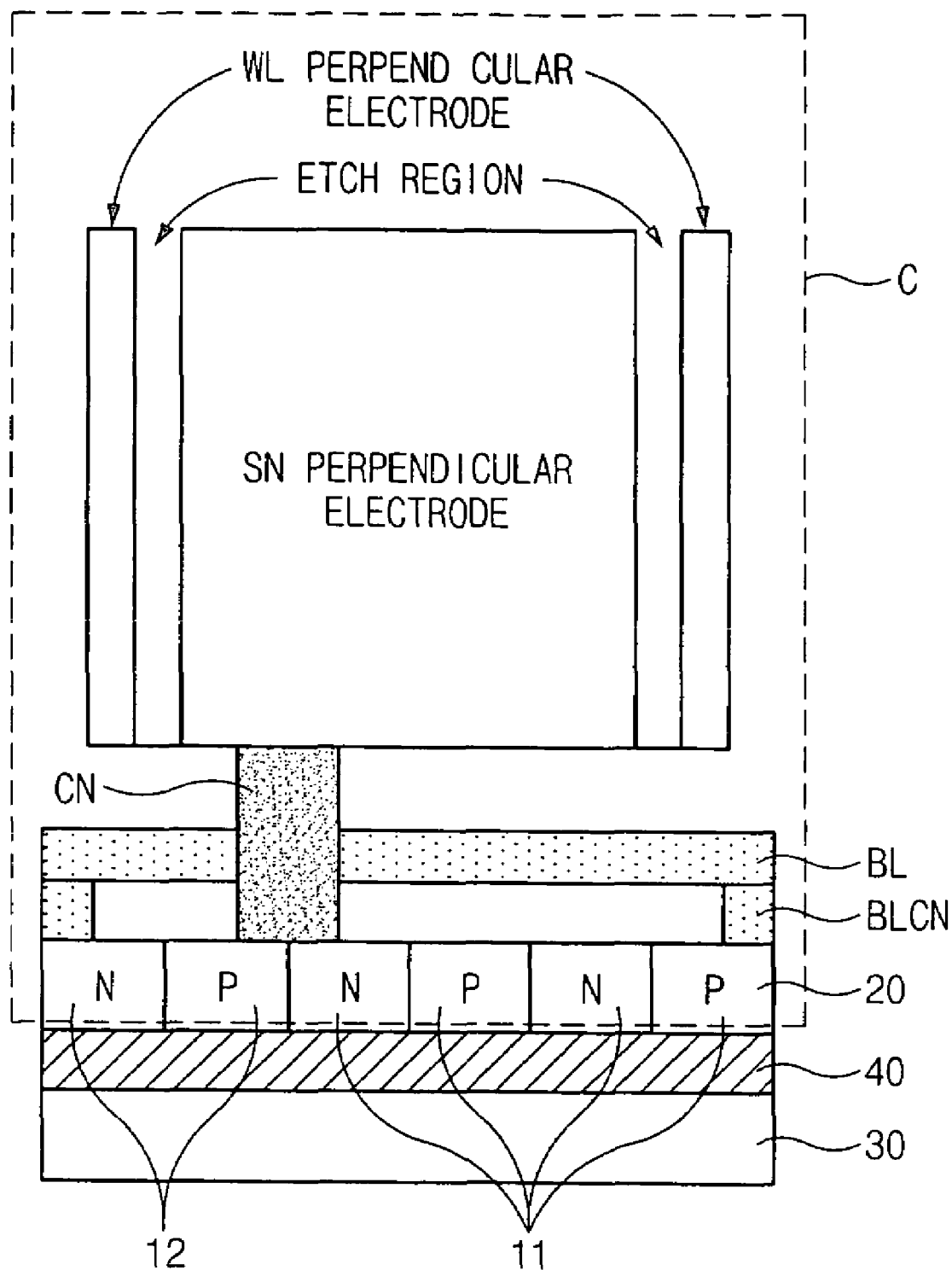
Figure 10:
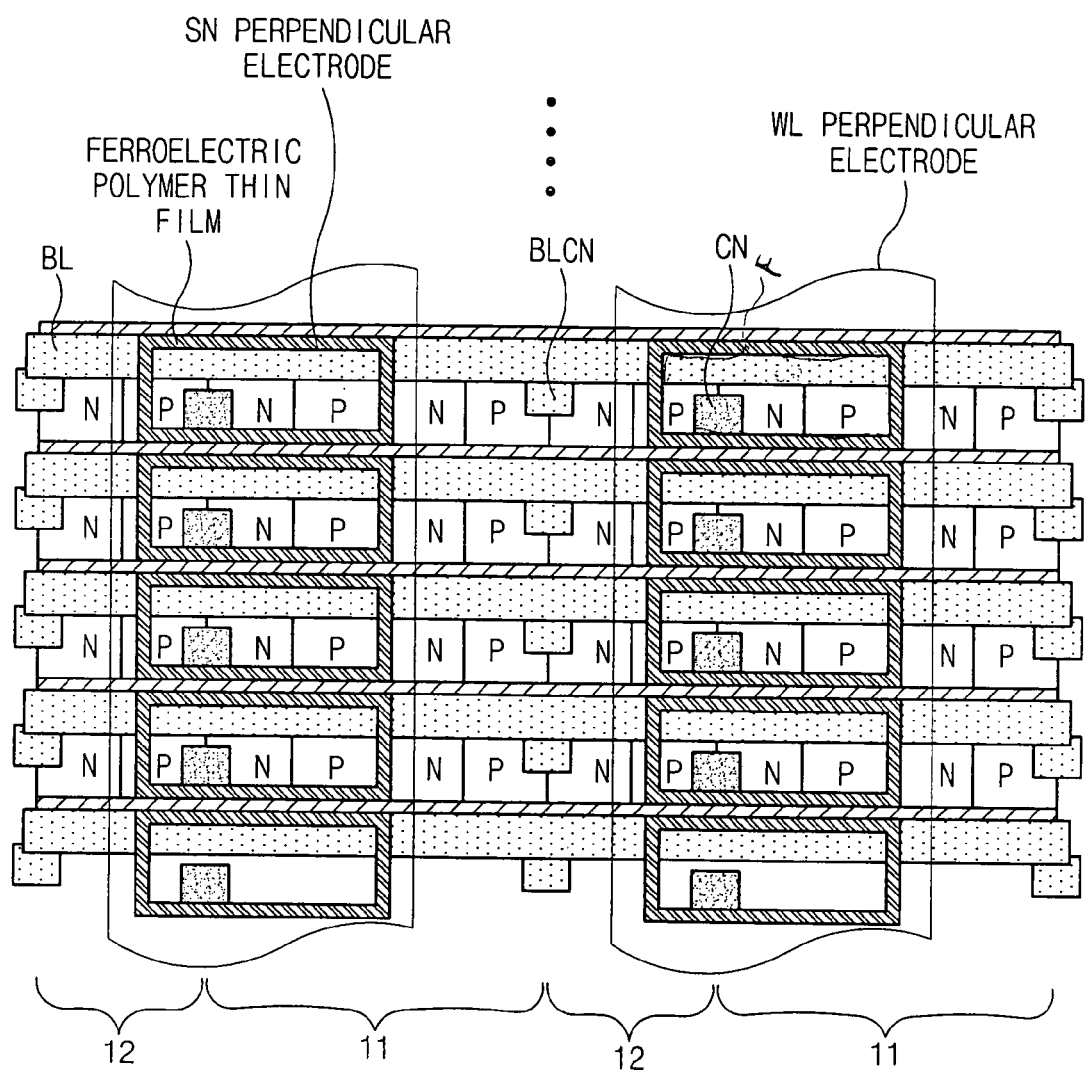
FIG. 10 is a plane diagram illustrating a perpendicular electrode structure having the serial PN diode chain whereon a word line WL, a bit line BL and a ferroelectric capacitor FC.
Figure 12:
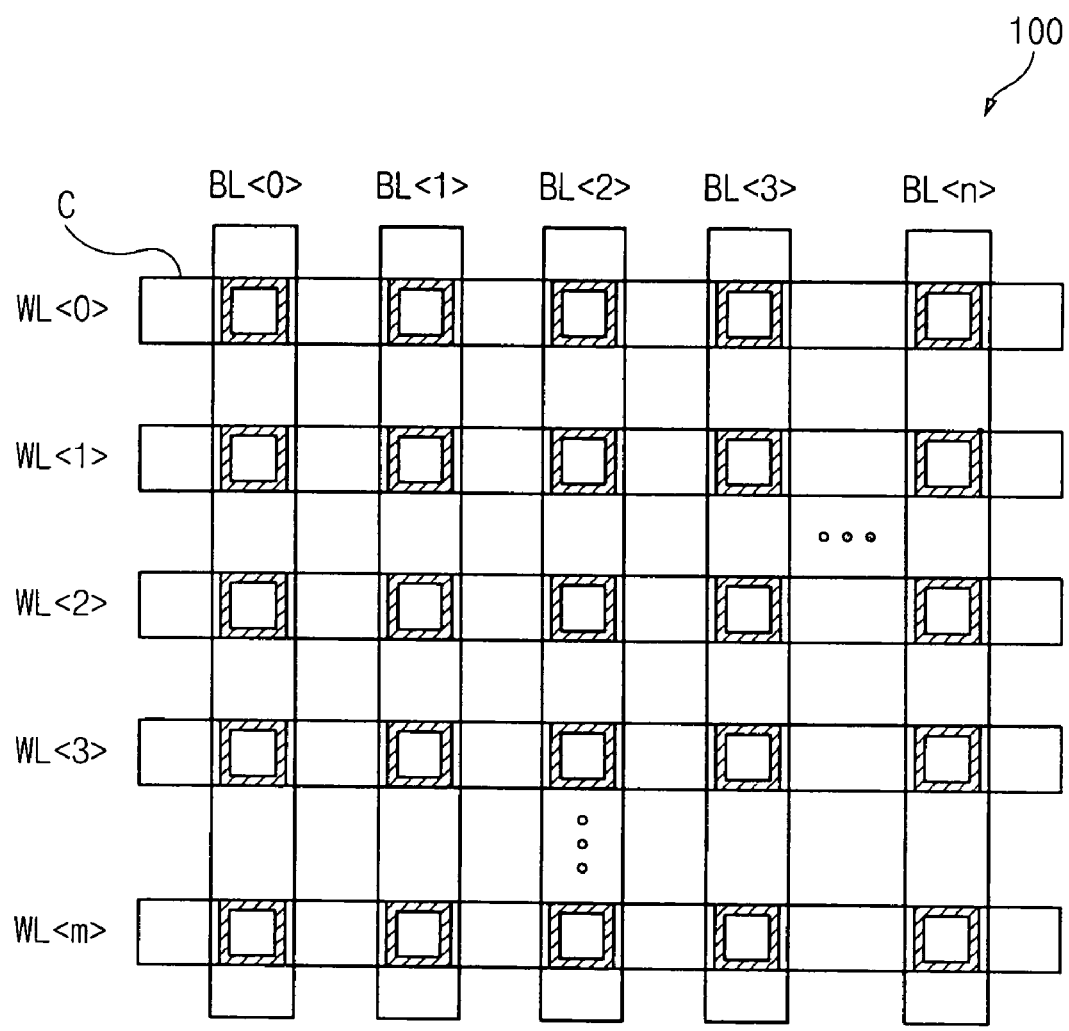
FIG. 12 is a plane diagram illustrating the structure of the perpendicular electrode cell array of FIG. 11.

As shown in FIG. 7, the deposited electrode material is etched to be separated into a word line WL perpendicular electrode and a SN perpendicular electrode as a storage electrode at a predetermined interval. Although FIG. 7 shows the cross section of the perpendicular electrode cell C where both sides of the electrode material are etched at a predetermined width, the electrode material can be etched to have a square belt (or donut) with a predetermined width as shown in FIGS. 10 and 12.

That is, the SN perpendicular electrode is separated from the WL perpendicular electrode at a predetermined interval, and formed with a square column type perpendicular to the serial PN diode switch 10. In the embodiment, the SN perpendicular electrode and the WL perpendicular electrode are both electrode layers of the ferroelectric capacitor FC, and particularly the WL perpendicular electrode serves as one electrode of the capacitor and the function of the word line WL at the same time.

Figure 8:
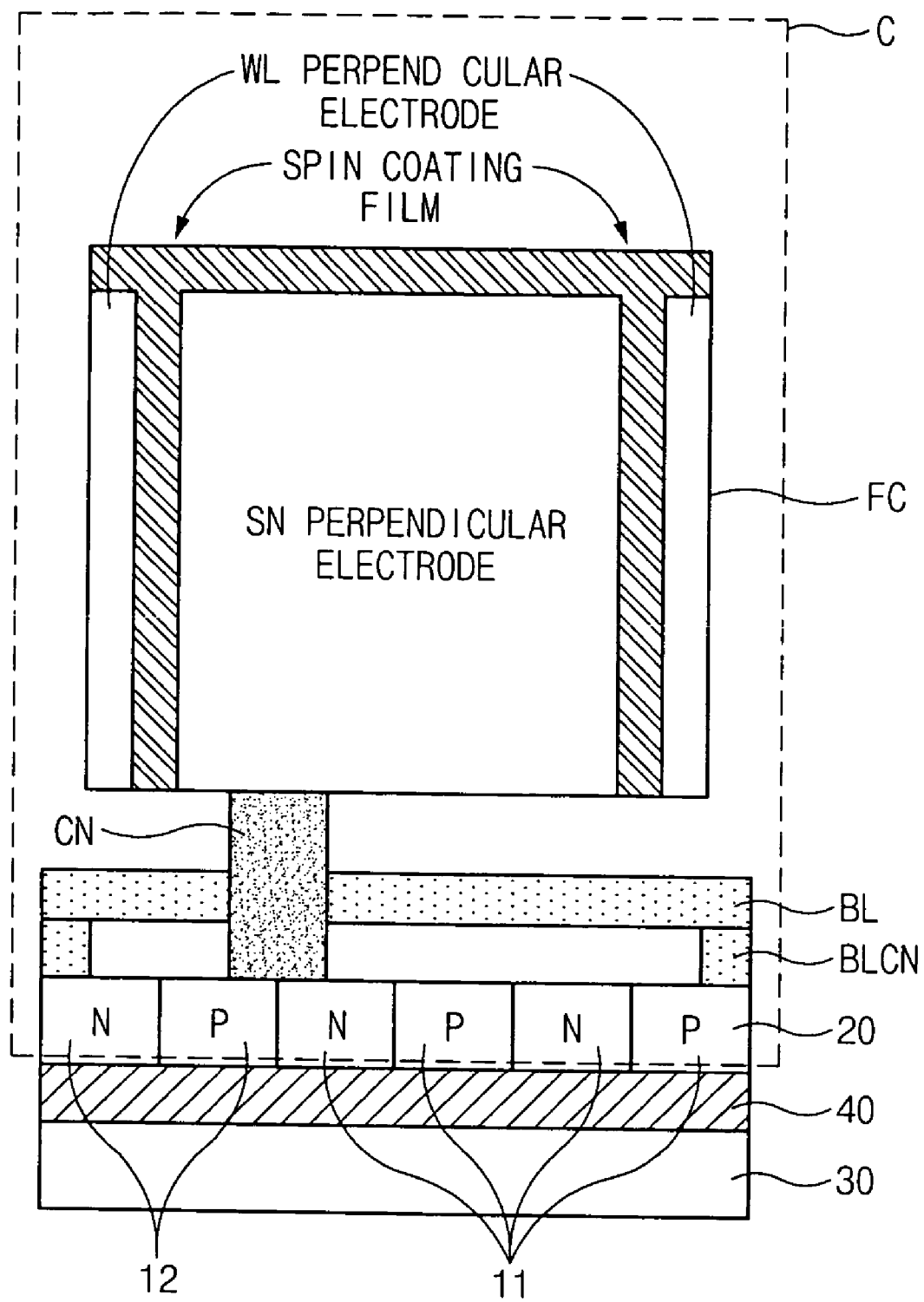

After the etching process is completed, a ferroelectric polymer thin film solution is spin-coated in a region where the SN perpendicular electrode is separated from the WL perpendicular electrode, and on the SN perpendicular electrode and the WL perpendicular electrode as shown in FIG. 8. The ferroelectric polymer thin film includes P(VDF-TreFE), PVDF, cyanopolymers, polyureas, polythioureas and odd-numbered nylons. In the ferroelectric capacitor FC according to the embodiment of the present invention, the SN perpendicular electrode and the WL perpendicular electrode are separated at a predetermined interval on the PN diode 12 and the PNPN diode 11 of the serial PN diode switch 10 to be perpendicular to the bit line BL, and the ferroelectric material is formed in the space between the SN perpendicular electrode and the WL perpendicular electrode.

Figure 9:
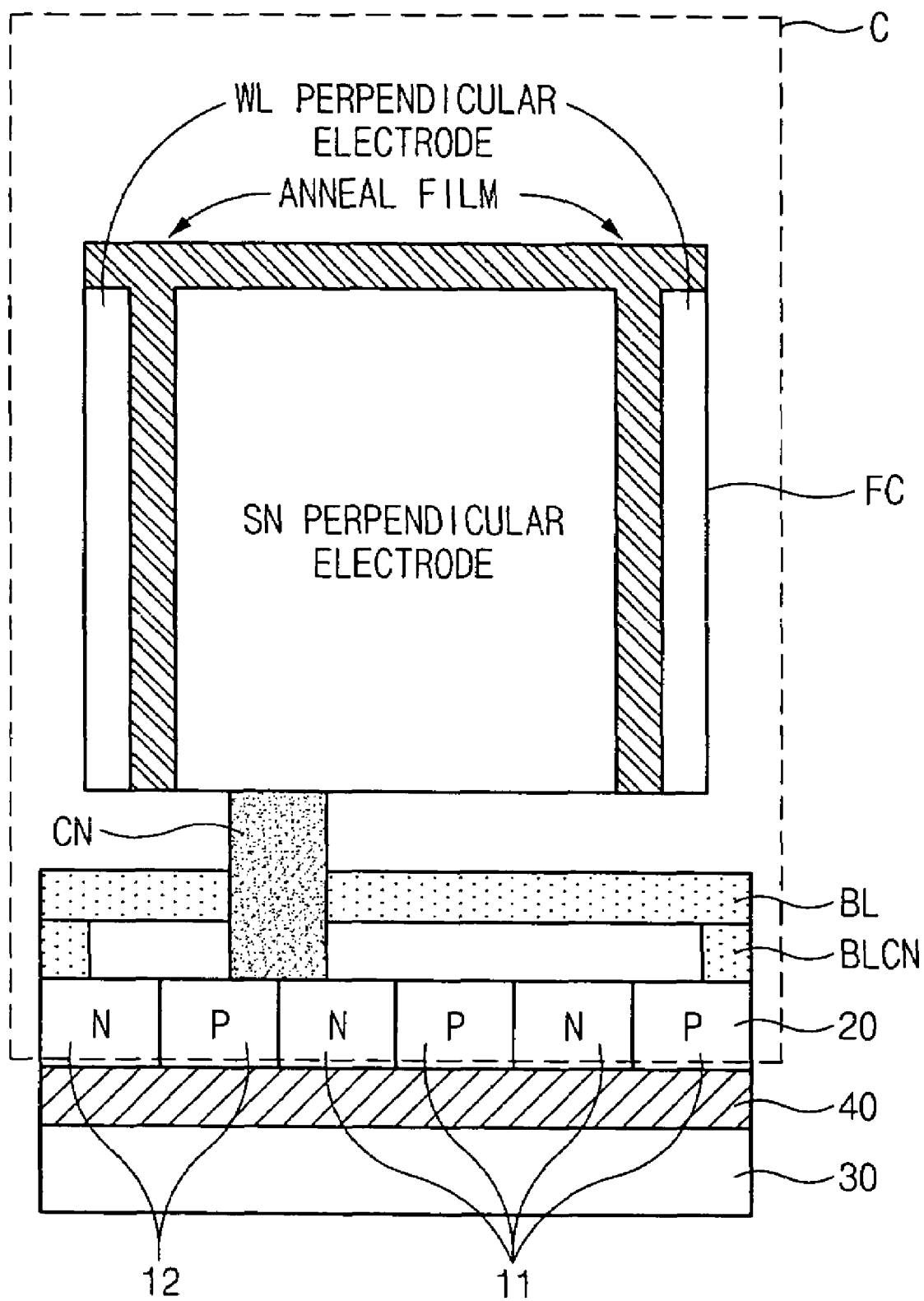

After the coating process of the ferroelectric polymer thin film solution is completed, the solvent is removed to represent polymerization characteristic in the coating process of the ferroelectric polymer thin film as shown in FIG. 9. Then, an anneal process is additionally performed on the ferroelectric polymer thin film for crystallization of the ferroelectric polymer thin film. Here, the anneal process is performed at a temperature of about less than 200° C.

As mentioned above, in formation of the cell, after the process for forming electrodes which requires the high temperature process is first performed, the coating process of the ferroelectric polymer thin film solution and the anneal process are later performed at the low temperature, so that the ferroelectric polymer thin film can be used which requires the low temperature process as a ferroelectric material of the ferroelectric capacitor FC. Furthermore, the perpendicular electrode cell is formed on the CMOS circuit device region 30, so that the process for forming a CMOS circuit device can be first performed which requires the high temperature process.

FIG. 10 is a plane diagram illustrating a perpendicular electrode structure having the serial PN diode chain including the word line WL, the bit line BL and the ferroelectric capacitor FC.

The bit line BL is formed on the contact surface of the serial PN diode chain 21 and the insulating isolation layer 22, and the bit line BL is connected the N terminal of the PN diode 12 and the P terminal of the PNPN diode 11 in the serial PN diode switch 10 through the bit line contact node BLCN.

Here, the bit line contact node BLCN is formed to contact with the N terminal of the PN diode 12 and the P terminal of the PNPN diode 11 to be shared with the adjacent cell. That is, the N terminal of the PN diode 12 in one cell is connected in common to the P terminal of the PNPN diode 11 in the adjacent cell and to the bit line contact node BLCN, and coupled with the bit line BL.

Then, the capacitor contact node CN is formed to be connected in common to the P terminal of the PN diode 12 and to the N terminal of the PNPN diode 11 in the serial PN diode chain 21. The word line WL as an exterior perpendicular electrode of the ferroelectric capacitor FC is formed perpendicular to the serial PN diode chain 21 at both sides of the SN perpendicular electrodes between the ferroelectric polymer thin films, and the word lines WL are crossed orthogonally with the bit lines.

Figure 11:
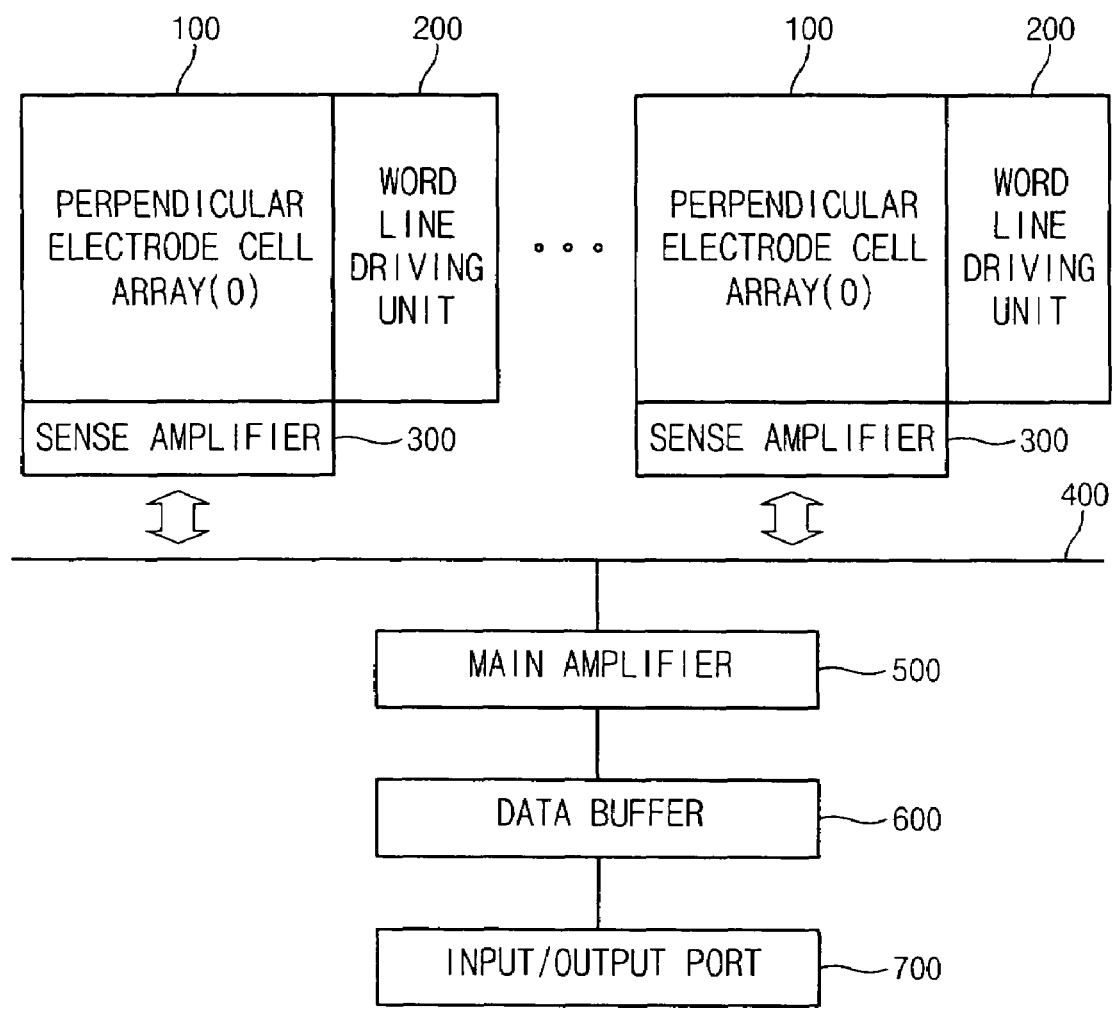
FIG. 11 is a diagram illustrating a nonvolatile ferroelectric memory device having a perpendicular electrode cell array according to an embodiment of the present invention.

FIG. 11 is a diagram illustrating a nonvolatile ferroelectric memory device having a perpendicular electrode cell array according to an embodiment of the present invention.

The nonvolatile ferroelectric memory device of FIG. 11 comprises a plurality of perpendicular electrode cell arrays 100, a plurality of word line driving units 200, a plurality of sense amplifier units 300, a data bus 400, a main amplifier unit 500, a data buffer unit 600 and an input/output port unit 700.

The perpendicular electrode cell array 100 includes a plurality of the perpendicular electrode cells C of FIG. 1 which are arranged in row and column directions with a matrix type. A plurality of word lines WL arranged in the row direction are connected to the word line driving units 200 and selectively activated by the word line driving units 200. A plurality of bit lines BL arranged in the column direction are connected to the sense amplifier units 300. Each of the sense amplifier units 300 comprises a plurality of sense amp lifiers S/A which correspond one by one to the bit lines BL.

The data bus 400, which is shared by the plurality of sense amplifier units 300, connects the main amplifier unit 500 to the plurality of sense amplifier units 300, thereby transmitting data.

The main amplifier unit 500 amplifies data applied from each sense amplifier unit 300 through data bus 400.

The data buffer unit 600 buffers data amplified in the main amplifier unit 500. The input/output port unit 700 externally outputs read data applied from the data buffer unit 600, and applies externally applied write data to the data buffer unit 600.

FIG. 12 is a plane diagram illustrating the structure of the perpendicular electrode cell array 100 of FIG. 11.

The perpendicular electrode cell array 100 includes a plurality of word line regions WL<0>~WL<n> and a plurality of bit line regions BL<0>~BL<m> that orthogonally cross each other. A unit cell C is located in a region where the word line regions WL<0>~WL<n> and the bit line regions BL<0>~BL<m> are crossed, so that a 'cross point cell' structure is embodied which does not require an additional area for formation of cells.

FIG. 12 shows that the perpendicular electrode cell C according to an embodiment of the present invention is formed as the cross point cell, and the bit line regions BL<0>~BL<m> include the bit lines BL and the serial PN diode chains 21 of FIG. 10.

Figure 13:
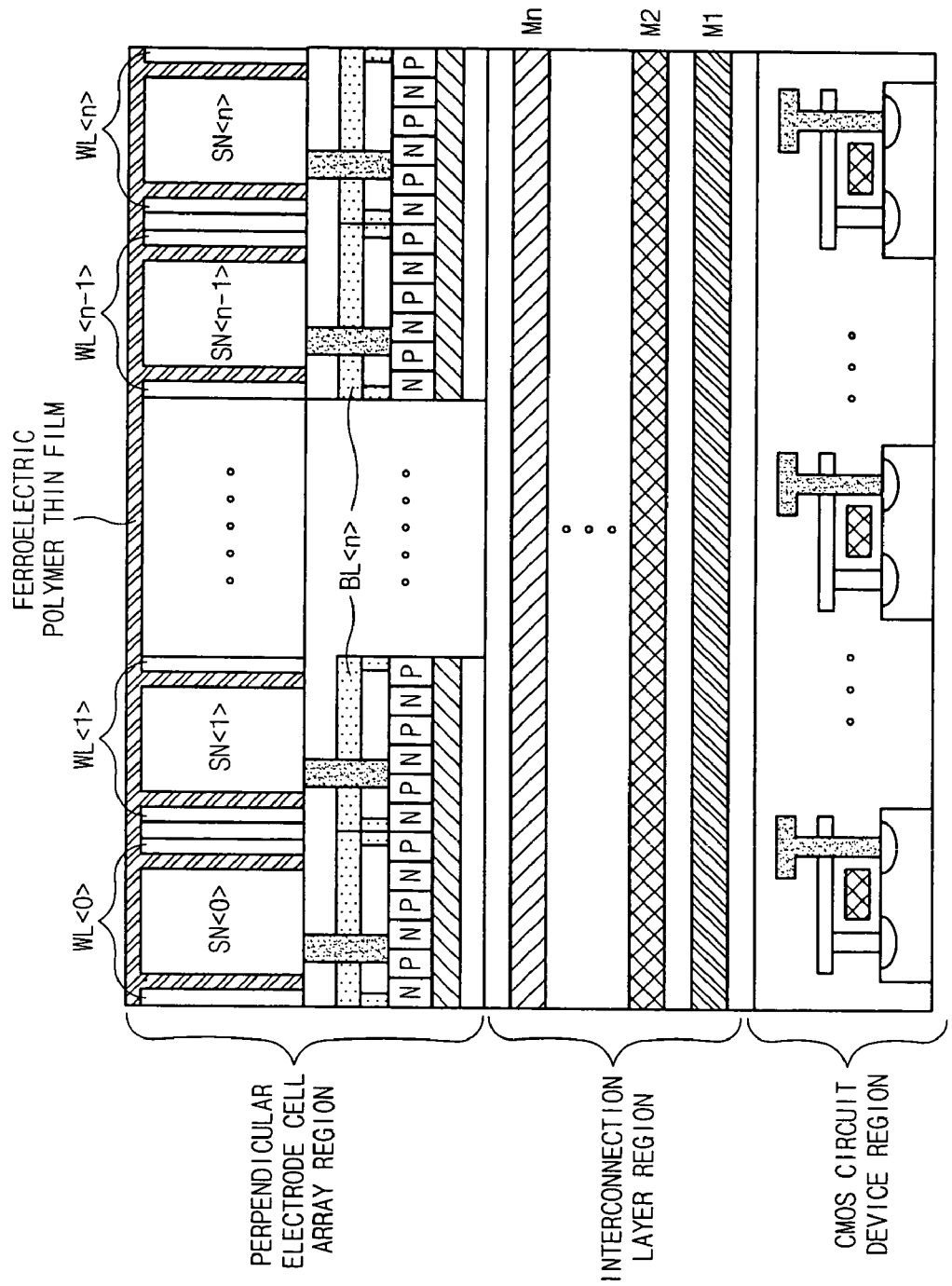
FIG. 13 is a cross-sectional diagram illustrating the cross section of the perpendicular electrode cell.

FIG. 13 is a cross-sectional diagram illustrating the cross section of the perpendicular electrode cell.

The CMOS circuit device region is formed in the bottom layer of the perpendicular electrode cell, and interconnection layer M1~Mn regions are formed on the CMOS circuit device region, that is, the middle layer of the perpendicular electrode cell.

The CMOS circuit device region includes the word line driving unit 200, the sense amplifier unit 300, the data bus 400, the main amplifier unit 500, the data buffer unit 600 and the input/output port unit 700.

The perpendicular electrode cell array region 100 is formed on the top of the interconnection layer, that is, the top layer of the perpendicular electrode cell.

Figure 14:
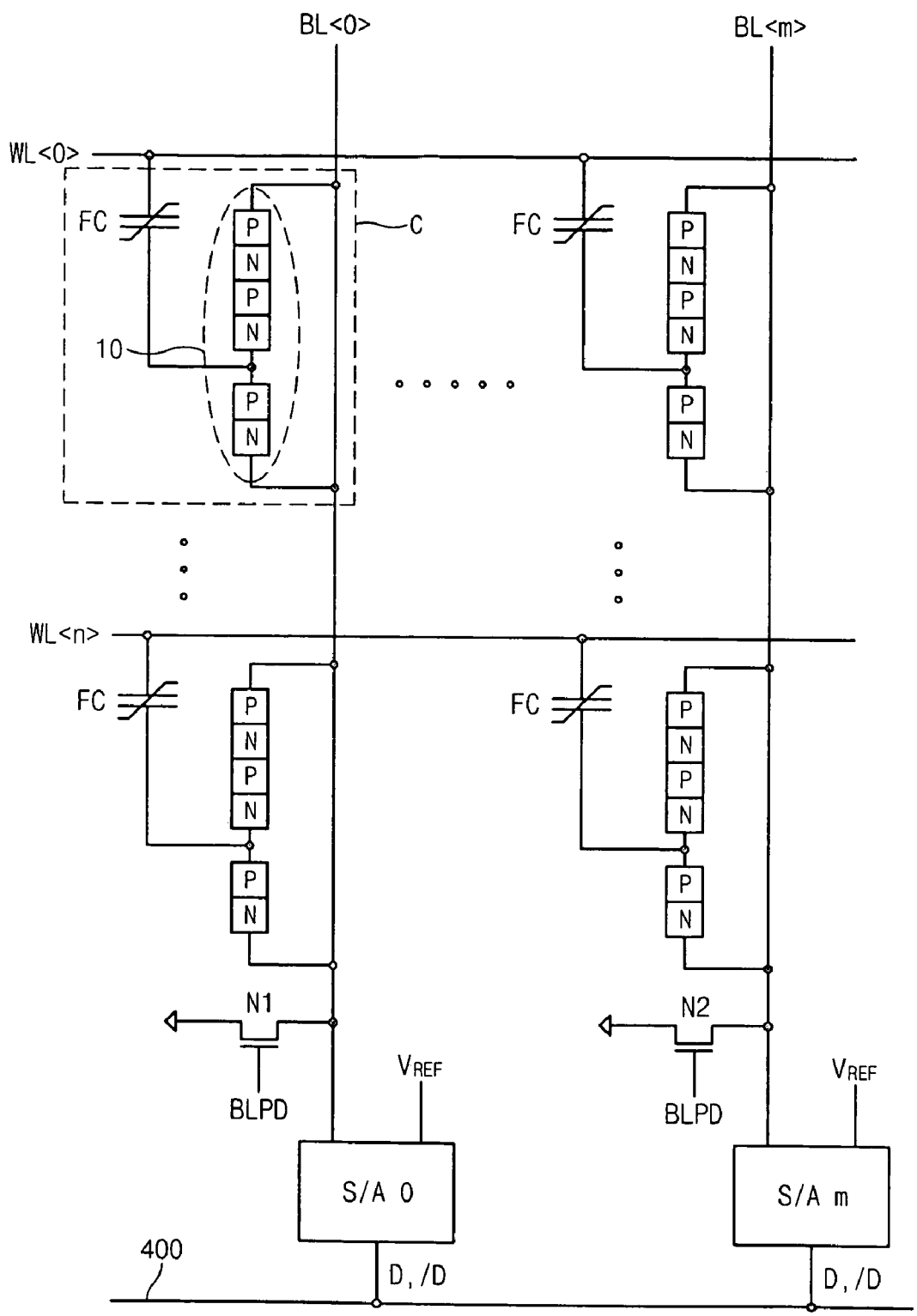
FIG. 14 is a circuit diagram illustrating the perpendicular electrode cell array of FIG. 11.

FIG. 14 is a circuit diagram illustrating the perpendicular electrode cell array 100 of FIG. 11.

One unit perpendicular electrode cell C comprises the ferroelectric capacitor FC having a perpendicular electrode structure and the serial PN diode switch 10 which are connected between the word line WL and the bit line BL. Each bit line BL is connected one by one to each of the sense amplifiers S/A0~S/Am. Each of the sense amplifiers S/A0~S/Am compares a previously set reference voltage $V_{REF}$ with the voltage applied to the bit line BL in response to a sense amplifier enable signal, and senses data. The sensed data D and /D are applied to the data bus 400 and transmitted to the main amplifier unit 500.

To each of the bit lines BL<0>~BL<m> are connected one by one bit line pull-down devices N1 and N2 for pulling down the bit lines BL<0>~BL<m> to the ground voltage level according to activation of a bit line pull-down signal BLPD.

Figure 15:
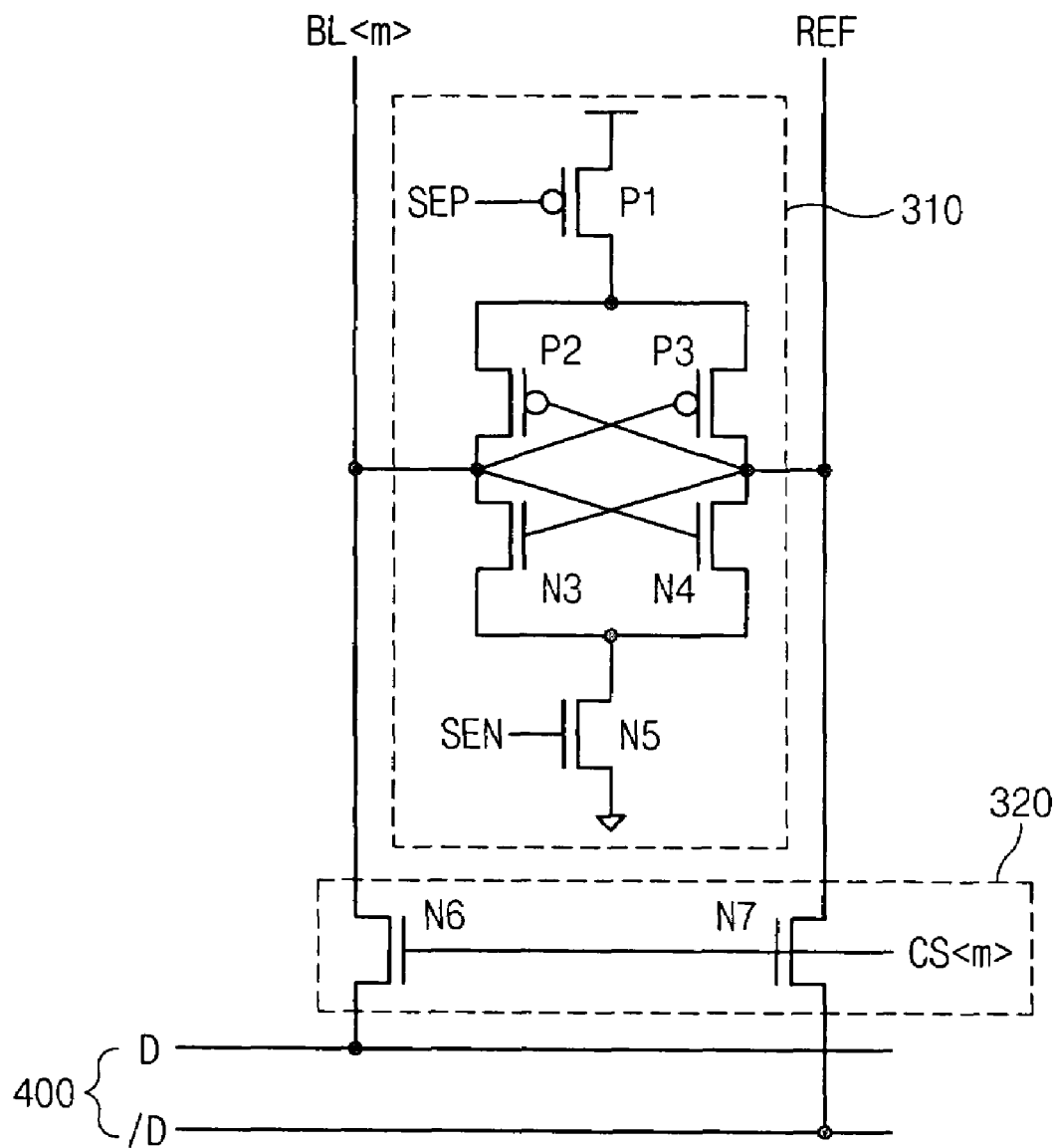
FIG. 15 is a circuit diagram illustrating a sense amplifier of FIG. 14.

FIG. 15 is a circuit diagram illustrating the sense amplifier S/A of FIG. 14.

The sense amplifier S/A comprises an amplification unit 310 and a column selecting switching unit 320.

The amplification unit 310 compares a cell voltage applied to the bit line BL<m> with the reference voltage $V_{REF}$ applied through a reference voltage application line REF in response to a senses amplifier enable signal SEP or SEN, and senses and amplifies cell data.

The amplification unit 310 comprises PMOS transistors P1~P3 and NMOS transistors N1~N3. The PMOS transistor P1, which is connected between a power voltage terminal and a common source terminal of the PMOS transistors P2 and P3, has a gate to receive the sense amplifier enable signal SEP. The cross-coupled PMOS transistors P2 and P3 latch the power voltage applied through the PMOS transistor P1. A NMOS transistor N5, which is connected between a ground voltage terminal and a common source terminal of the NMOS transistors N3 and N4, has a gate to receive the sense amplifier enable signal SEN. The cross-coupled NMOS transistors N3 and N4 latch the ground voltage applied through the NMOS transistor N5. Here, the sense amplifier enable signal SEN has an opposite phase to that of the sense amplifier enable signal SEP.

The column selecting switching unit 320 transmits the data D and /D sensed and amplified in the amplification unit 310 to the data bus 400 in response to a column selecting signal CS<m>. The column selecting switching unit 320 comprises NMOS transistors N6 and N7. The NMOS transistor N6, which is connected between the bit line BL<m> and the data bus 400, controls the input/output operation of the data /D in response to the column selecting signal CS<m> applied through its gate. The NMOS transistor N7, which is connected between the reference voltage application line REF and the data bus 400, controls the input/output operation of the data D in response to the column selecting signal CS<m> applied through its gate.

Figure 16:
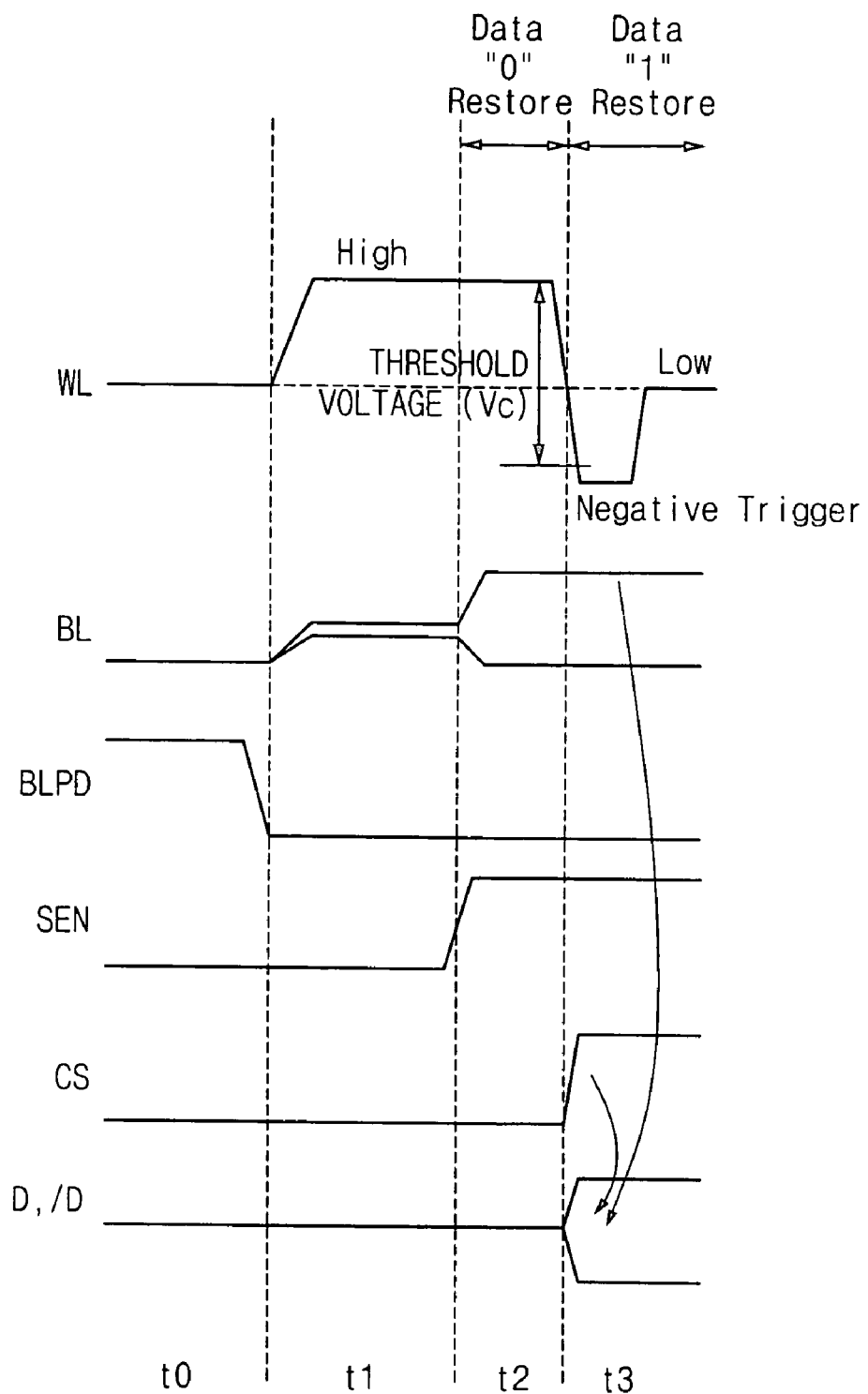
FIG. 16 is a timing diagram illustrating the read mode of the nonvolatile ferroelectric memory device according to an embodiment of the present invention.

FIG. 16 is a timing diagram illustrating the read mode of the nonvolatile ferroelectric memory device according to an embodiment of the present invention.

In a period t0, before the word line WL is activated to a precharge period, the bit line pull-down signal BLPD is activated, so that the bit line BL is precharged to the ground level.

Next, when a period t1 starts, the bit line pull-down signal BLPD is transited to 'low', and then the specific word line WL is transited to 'high' by the word line driving unit 200. As a result, the PN diode 12 of the perpendicular electrode cell C is turned on, and the cell data is transmitted to the bit line BL.

In a period t2, when the sense amplifier enable signal SEN is activated to 'high', the data in the bit line BL is amplified in the amplification unit 310. When the cell data applied to the bit line BL is '0', the voltage of the bit line BL is amplified to 'low' by the amplification unit 310 while the voltage level of the word line WL is 'high'. As a result, the data '0' is written (restored) in the perpendicular electrode cell C by a voltage difference between the word line WL and the bit line BL.

Thereafter, in a period t3, the voltage of the word line WL is lowered below the threshold voltage Vc, and transited to a negative voltage, so that the data '1' is restored in the perpendicular electrode cell C.

That is, when the cell data is '0', the amplified voltage of the bit line BL is not larger than that of the word line WL by over the threshold voltage Vc although the voltage of the word line WL is lowered to the negative voltage, so that the PNPN diode 11 is kept off.

However, when the cell data is '1', the amplified voltage of the bit line BL is larger than that of the word line WL by over the threshold voltage Vc since the voltage of the word line WL is lowered to the negative voltage. As a result, the PNPN diode 11 is turned on, and the amplified data '1' is written (restored). Therefore, the data '0' is restored in the period t2, and the data '1' is restored in the period t3.

In the period t3, the column selecting signal CS is transited to 'high', and the amplified data D and /D of the bit line BL are transmitted to the main amplifier unit 500 through the data bus 400, so that data stored in the cell C is read.

In the period t3, after the PNPN diode 11 is turned on, the PNPN diode 11 is kept on by the small voltage difference Vs shown in the operation characteristic of FIG. 5. As a result, the voltage of the word line WL is raised from the negative state to the low state.

Figure 17:
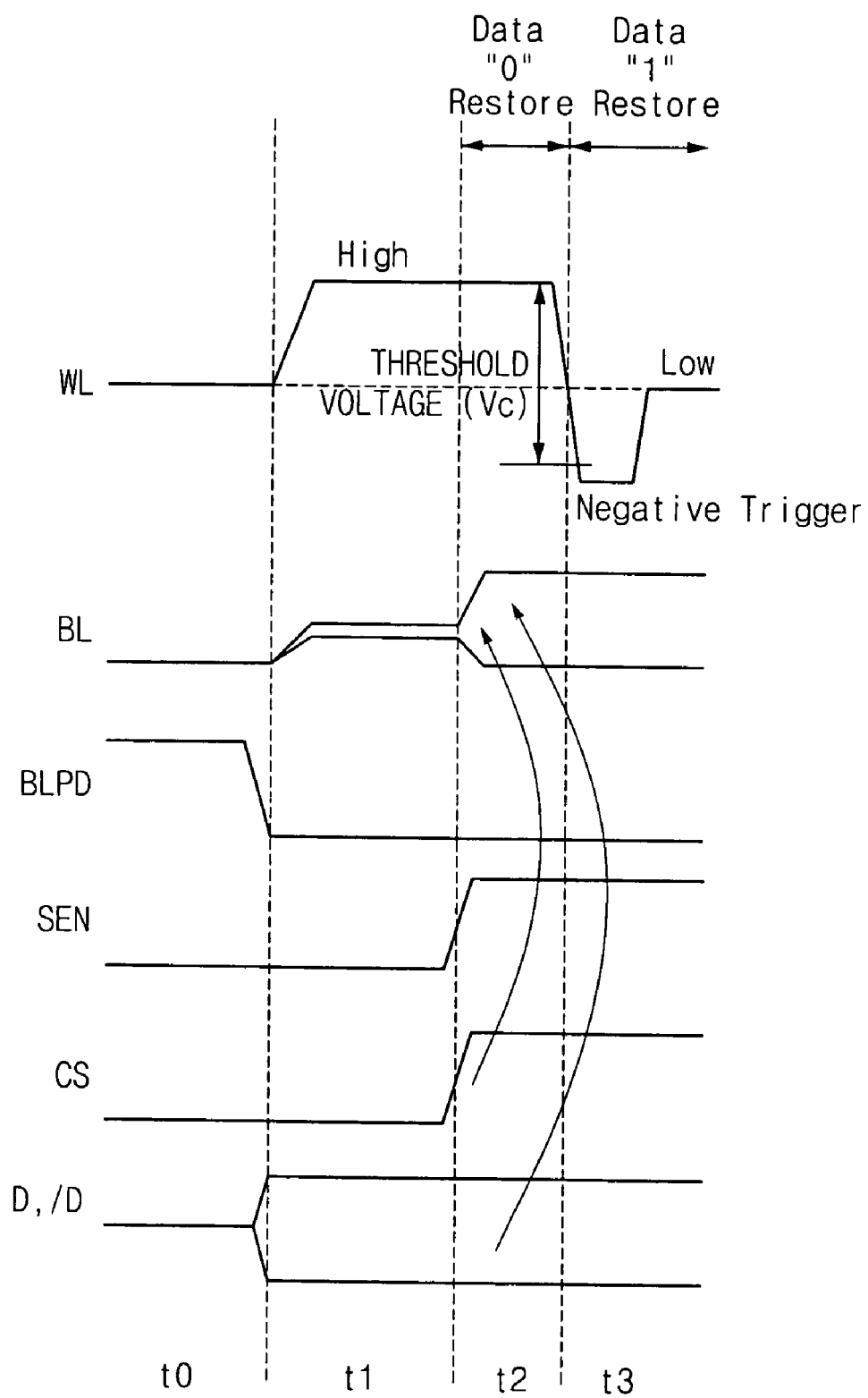
FIG. 17 is a timing diagram illustrating the write mode of the nonvolatile ferroelectric memory device according to an embodiment of the present invention.

FIG. 17 is a timing diagram illustrating the write mode of the nonvolatile ferroelectric memory device according to an embodiment of the present invention.

In a period t0 as a precharge period, before the word line WL is activated, the bit line pull-down signal BLPD is activated, and the bit line BL is precharged to the ground level.

When a period t1 starts, the bit line pull-down signal BLPD is transited to 'low', and the word line WL is activated to 'high'. Then, data of the perpendicular electrode cell is transmitted to the bit line BL.

In a period t2, the data D and /D applied through the data bus 400 are transmitted to the bit line BL by activation of the column selecting signal CS, and the voltage of the bit line BL is amplified by activation of the sense amplifier enable signal SEN. Here, when the write data D and /D are '0', the voltage of the bit line BL is amplified to the low level while the voltage level of the word line WL is 'high'. As a result, the data '0' is written in the perpendicular electrode cell C by the voltage difference of the word line WL and the bit line BL.

Thereafter, in a period t3, the voltage of the word line WL is lowered below the threshold voltage Vc and transited to the negative voltage, so that the data '1' is written in the perpendicular electrode cell. As shown in the restoration operation, when the cell data is '0', although the voltage of the word line WL is lowered to the negative voltage, the voltage of the bit line BL is not larger than that of the word line WL by over the threshold voltage Vc, so that the PNPN diode 11 is kept off.

However, when the cell data is '1', the voltage of the bit line BL is larger than that of the word line WL by over the threshold voltage Vc since the voltage of the word line WL is lowered to the negative voltage. As a result, the PNPN diode 11 is turned on, and the data '1' is written in the cell C. Therefore, the data '0' is written in the period t2, and the data '1' is written in the period t3.

In the period t3, after the PNPN diode 11 is turned on, the PNPN diode 11 is kept on by the small voltage difference Vs shown in the operation characteristic of FIG. 5. As a result, the voltage of the word line WL is raised from the negative state to the low state.

As described above, in a perpendicular electrode cell and a nonvolatile ferroelectric memory using the same according to an embodiment of the present invention, an improved cell structure is provided where a ceramic ferroelectric material used in a ferroelectric capacitor can be substituted with a ferroelectric polymer thin film having a perfect hysteresis loop curve with its small size which enables both low and high temperature processes. As a result, the process cost is reduced, and the uniformity of the cell is improved, which results in advance of productivity and embodiment of a high density memory.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric perpendicular electrode cell comprising:
    a ferroelectric capacitor including: a storage node perpendicular electrode which is a lower electrode; a word line perpendicular electrode which is an upper electrode formed to enclose the circumference of the lower electrode; and a ferroelectric film having a ferroelectric material filled in a space where the lower electrode and the upper electrode; and
    a serial PN diode switch, connected between a bit line and the ferroelectric capacitor, for selectively switching a current direction between the bit line and the ferroelectric capacitor depending on voltage change between the bit line and the ferroelectric capacitor.

2. The nonvolatile ferroelectric perpendicular electrode cell according to claim 1, wherein the ferroelectric material is a ferroelectric polymer thin film that is a low temperature ferroelectric film.

3. The nonvolatile ferroelectric perpendicular electrode cell according to claim 1, wherein the serial PN diode switch comprises:
    a PN diode connected in a forward direction between the second electrode and the bit line; and
    a PNPN diode connected in a backward direction between the second electrode and the bit line.

4. The nonvolatile ferroelectric perpendicular electrode cell according to claim 3, wherein the bit line is connected to a N terminal of the PN diode and a final P terminal of the PNPN diode, and
    the second electrode is connected to a P terminal of the PN diode and a N terminal of the PNPN diode adjacent to the P terminal.

* * * * *